United States Patent [19]

Shimizu et al.

[11] Patent Number: 5,267,146
[45] Date of Patent: Nov. 30, 1993

[54] SYSTEM FOR DESIGNING CONFIGURATION WITH DESIGN ELEMENTS CHARACTERIZED BY FUZZY SETS

[75] Inventors: Yoji Shimizu, Yokosuka; Tomio Jindo, Yokohama; Shizu Ohshima; Kiyomi Hirasago, both of Yokosuka, all of Japan

[73] Assignee: Nissan Motor Co., Ltd., Yokohama, Japan

[21] Appl. No.: 738,373

[22] Filed: Jul. 31, 1991

[30] Foreign Application Priority Data

Aug. 1, 1990 [JP] Japan .................. 2-202396

[51] Int. Cl.$^5$ .............................. G06F 9/44
[52] U.S. Cl. .................. 364/400; 364/401; 395/11; 395/900; 395/919; 395/921
[58] Field of Search .......... 395/900, 61, 919, 921, 395/11; 364/400, 401

[56] References Cited

U.S. PATENT DOCUMENTS

| | | | |
|---|---|---|---|
| 4,837,725 | 6/1989 | Yamakawa | 395/3 |
| 4,858,146 | 8/1989 | Shebini | 364/512 |
| 4,966,118 | 10/1990 | Itakura | 395/900 |
| 5,025,499 | 6/1991 | Inoue et al. | 395/10 |
| 5,138,554 | 8/1992 | Wada | 364/424.05 |

OTHER PUBLICATIONS

Coyne et al, "Knowledge Based Design Systems," Addison-Wesley, 1990, pp. 291-292, 313-319, 382-383.
Chiu et al., "A Fuzzy Logic Programming Environment for Real-Time Control," Inter. Journ. of Approx. Reasoning, 1988, 2, 163-175.
Changwen et al., "Fuzzy Optimum Design of the Tanker Midship Section with Static and Dynamic Contraints," Int Shipbuild Progr 36 No. 408 (1989) pp. 367-384.
Bookstein, "Fuzzy Requests: An Approach to Weighted Bodean Searches," Jour. of Amer Society For Info Sci, Jul. 1980, pp. 240-247.
Watanabe et al., "A VLSI Fuzzy Logic Controller with Reconfigurable, Cascadable Architecture," IEEE Jour. of Solid State Circuits, vol. 25 No. 2, Apr. 1990 pp. 376-382.

*Primary Examiner*—Allen R. MacDonald
*Attorney, Agent, or Firm*—Pennie & Edmonds

[57] ABSTRACT

A system for designing a configuration capable of accounting for subtle variations of each design element involved. In this system, evaluation terms which expresses impressions associated with the design elements of the configuration is entered; a fuzzy knowledge data-base for memorizing relationships between the evaluation terms and the design elements in terms of fuzzy sets represented by membership functions is prepared; a pattern of each design element appropriate for the evaluation terms entered at the entering step is inferred according to the fuzzy knowledge data-base, and the configuration is constructed from the inferred pattern of each design element; and the constructed configuration is outputted.

10 Claims, 17 Drawing Sheets

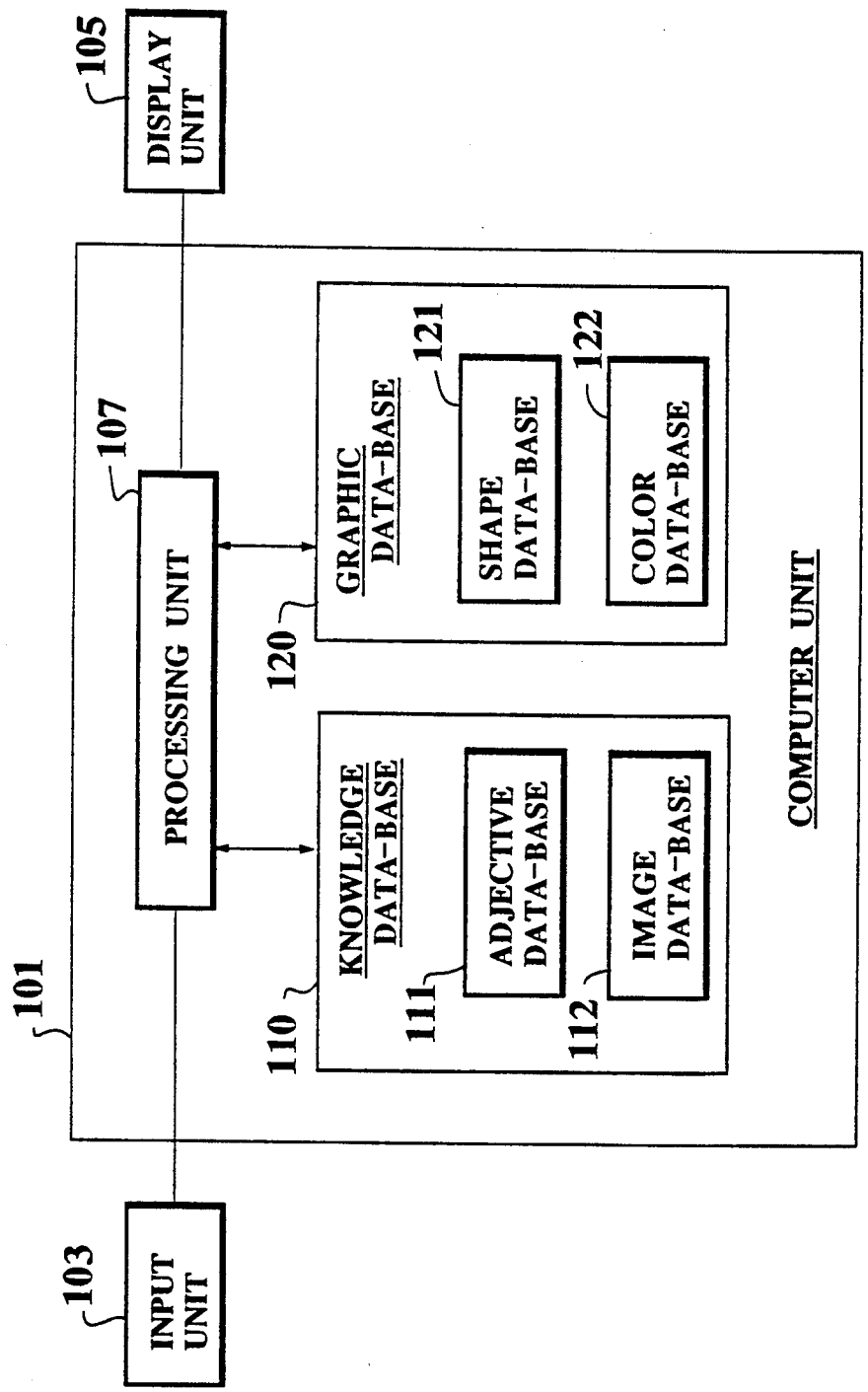

FIG.2 PRIOR ART

| EVALUATION TERMS | FACTOR 1 | FACTOR 2 | FACTOR 3 | FACTOR 4 | FACTOR 5 | FACTOR 6 | FACTOR 7 | FACTOR 8 | FACTOR 9 | FACTOR 10 |
|---|---|---|---|---|---|---|---|---|---|---|
| PLEASING — DISGUSTING | 0.99 | 0.11 | 0.06 | 0.20 | 0.07 | 0.10 | 0.05 | 0.10 | 0.03 | 0.02 |
| PLEASANT — SICKENING | 0.92 | 0.05 | 0.12 | 0.16 | 0.06 | 0.08 | 0.04 | -0.05 | 0.10 | -0.09 |
| EASY TO CONCENTRATE — DISTRACTIVE | 0.85 | -0.12 | 0.06 | -0.12 | 0.02 | -0.08 | 0.11 | 0.11 | 0.08 | 0.15 |
| NICELY DESIGNED — BADLY DESIGNED | 0.83 | 0.24 | 0.16 | 0.03 | -0.06 | 0.05 | 0.06 | -0.07 | -0.01 | -0.06 |
| SPORTY — NON-SPORTY | 0.17 | 0.89 | -0.04 | -0.07 | -0.07 | 0.06 | 0.00 | 0.01 | -0.06 | 0.06 |
| SUITABLE FOR FAST DRIVING — SUITABLE FOR ALL TASTE | -0.14 | 0.80 | 0.02 | -0.18 | -0.20 | -0.09 | -0.01 | 0.07 | 0.04 | 0.04 |
| ACTIVE — NON-ACTIVE | 0.06 | 0.70 | -0.07 | -0.04 | 0.00 | 0.10 | 0.05 | 0.04 | -0.03 | -0.09 |
| HIGH GRADE — ORDINARY | 0.26 | 0.11 | 0.85 | -0.05 | 0.06 | -0.04 | 0.07 | 0.05 | 0.15 | 0.02 |
| GORGEOUS — SIMPLE | 0.08 | 0.11 | 0.76 | 0.11 | -0.03 | 0.14 | 0.09 | -0.12 | 0.01 | 0.02 |
| LUXURIOUS — MODEST | 0.11 | 0.22 | 0.71 | 0.11 | -0.02 | 0.14 | 0.11 | -0.10 | -0.06 | 0.05 |
| CURVY — LINEAR | 0.08 | 0.09 | 0.12 | 0.69 | 0.05 | -0.21 | 0.13 | 0.06 | -0.03 | -0.13 |
| CUTE — UGLY | 0.17 | 0.19 | -0.10 | 0.62 | 0.17 | 0.24 | -0.03 | 0.12 | 0.04 | 0.13 |
| LIGHT — DARK | 0.18 | -0.18 | -0.03 | 0.23 | 0.80 | -0.06 | -0.04 | 0.06 | 0.07 | 0.07 |
| WHITISH — BLACKISH | 0.18 | -0.09 | 0.03 | 0.14 | 0.75 | 0.16 | 0.01 | -0.07 | 0.00 | 0.02 |
| MERRY — MOODY | 0.18 | 0.44 | 0.00 | 0.11 | 0.07 | 0.63 | 0.13 | -0.05 | 0.16 | -0.11 |
| BRIGHT — DARK | 0.22 | 0.16 | -0.06 | -0.02 | 0.31 | 0.58 | 0.06 | -0.35 | 0.07 | -0.16 |
| MULTI-FUNCTIONAL — MONO-FUNCTIONAL | 0.15 | -0.09 | 0.32 | 0.02 | 0.01 | 0.07 | 0.59 | -0.07 | 0.00 | -0.11 |
| SPECIALIZED — INDIVIDU-ALISTIC | 0.12 | -0.16 | 0.03 | -0.07 | -0.01 | -0.09 | 0.03 | 0.62 | 0.00 | -0.05 |
| SPACIOUS — NARROW | 0.45 | 0.00 | 0.40 | -0.03 | 0.03 | 0.06 | 0.00 | -0.07 | 0.60 | 0.09 |
| FLAT — BUMPY | 0.37 | -0.04 | 0.09 | 0.01 | 0.09 | -0.03 | -0.02 | -0.03 | 0.00 | 0.62 |

FIG.3
PRIOR ART

| ITEM | CATEGORY |
|---|---|
| METER SIZE | 1. LARGE  2. MEDIUM  3. SMALL |
| INSTRUMENT PANEL THICKNESS | 1. LARGE  2. MEDIUM  3. SMALL |
| COLOR OF METER INDICATOR | 1. ORANGE  2. RED  3. WHITE |
| NUMBER OF SPOKES | 1. TWO  2. THREE  3. FOUR |
| STEERING WHEEL RADIUS | 1. LARGE  2. MDIUM  3. SMALL |
| PAD SIZE | 1. LARGE  2. MEDIUM  3. SMALL |
| DOOR POCKET | 1. EXISTENT  2. NON−EXISTENT |

FIG.4 PRIOR ART

| ITEM | NUMBER OF METERS | | | | | INSTRUMENT PANEL & METER CLUSTER | | METER CLUSTER & CENTER CONSOLE | | DOOR THICKNESS | | CENTER CLUSTER PROJECTION | | ARM |
|---|---|---|---|---|---|---|---|---|---|---|---|---|---|---|
| CATEGORY / EVALUATION TERM | LARGE×1 | LARGE×1 SMALL×2 | LARGE×1 SMALL×3 | LARGE×2 SMALL×1 | LARGE×2 SMALL×2 | UNIFIED | SEPARATED | UNIFIED | SEPARATED | THICK | THIN | PROJECTED | NOT PROJECTED | HORIZONTAL |
| EASY TO CONCENTRATE | 0.32 | *0.42 | 0.21 | -0.25 | -0.45 | *0.23 | -0.26 | *0.26 | -0.34 | *0.11 | -0.09 | *0.10 | -0.06 | -0.03 |
| HARD TO CONCENTRATE | -0.32 | -0.42 | -0.21 | 0.25 | *0.45 | -0.23 | *0.26 | -0.26 | *0.34 | -0.11 | *0.09 | -0.19 | 0.06 | *0.03 |
| SUITABLE FOR FAST DRIVING | -0.52 | -0.55 | -0.15 | *0.56 | 0.46 | *0.16 | -0.12 | *0.15 | -0.23 | *0.19 | -0.22 | *0.16 | -0.08 | -0.23 |
| SUITABLE FOR ALL TASTE | 0.52 | *0.55 | 0.15 | -0.56 | -0.46 | -0.16 | *0.12 | -0.15 | *0.23 | -0.19 | *0.22 | -0.16 | *0.08 | *0.23 |
| GORGEOUS | -0.78 | -0.36 | -0.09 | 0.13 | *0.51 | -0.03 | *0.06 | *0.06 | -0.03 | *0.38 | -0.54 | -0.13 | *0.21 | *0.19 |
| MODEST | *0.78 | 0.36 | 0.09 | -0.13 | -0.51 | *0.03 | -0.06 | -0.06 | *0.03 | -0.38 | *0.54 | *0.13 | -0.21 | -0.19 |
| BRIGHT | -0.24 | -0.06 | -0.10 | 0.10 | *0.29 | *0.13 | -0.08 | *0.36 | -0.19 | -0.08 | *0.16 | -0.28 | *0.36 | *0.16 |
| DARK | *0.24 | 0.06 | 0.01 | -0.10 | -0.29 | -0.13 | *0.08 | -0.36 | *0.19 | *0.08 | -0.16 | *0.28 | -0.36 | -0.16 |
| SPACIOUS | 0.11 | *0.13 | -0.15 | -0.03 | -0.06 | *0.42 | -0.37 | *0.39 | -0.26 | -0.11 | *0.23 | -0.59 | *0.56 | *0.12 |
| NARROW | -0.11 | -0.13 | *0.15 | 0.03 | 0.06 | -0.42 | *0.37 | -0.39 | *0.29 | *0.11 | -0.23 | *0.59 | -0.56 | -0.12 |

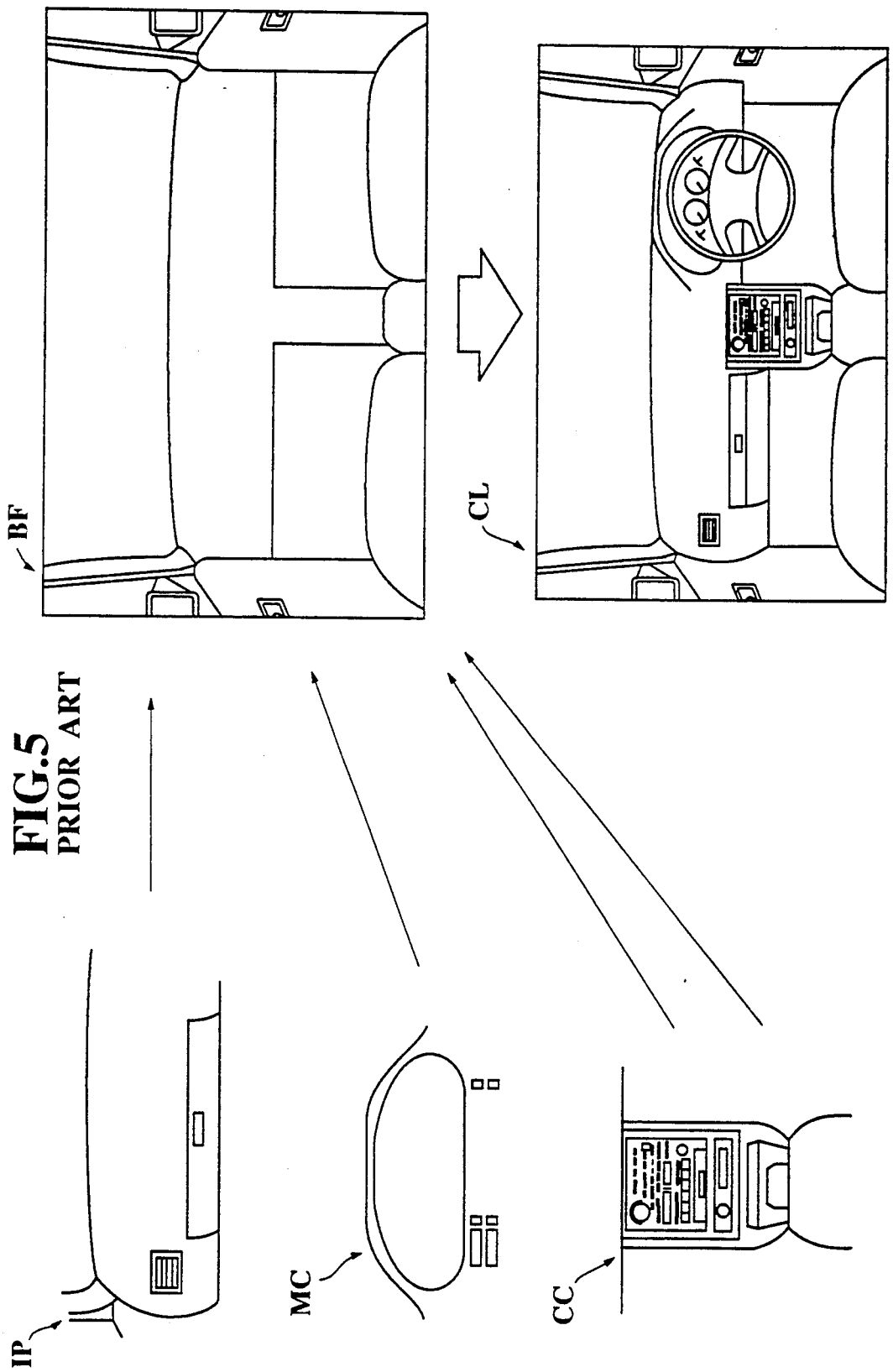

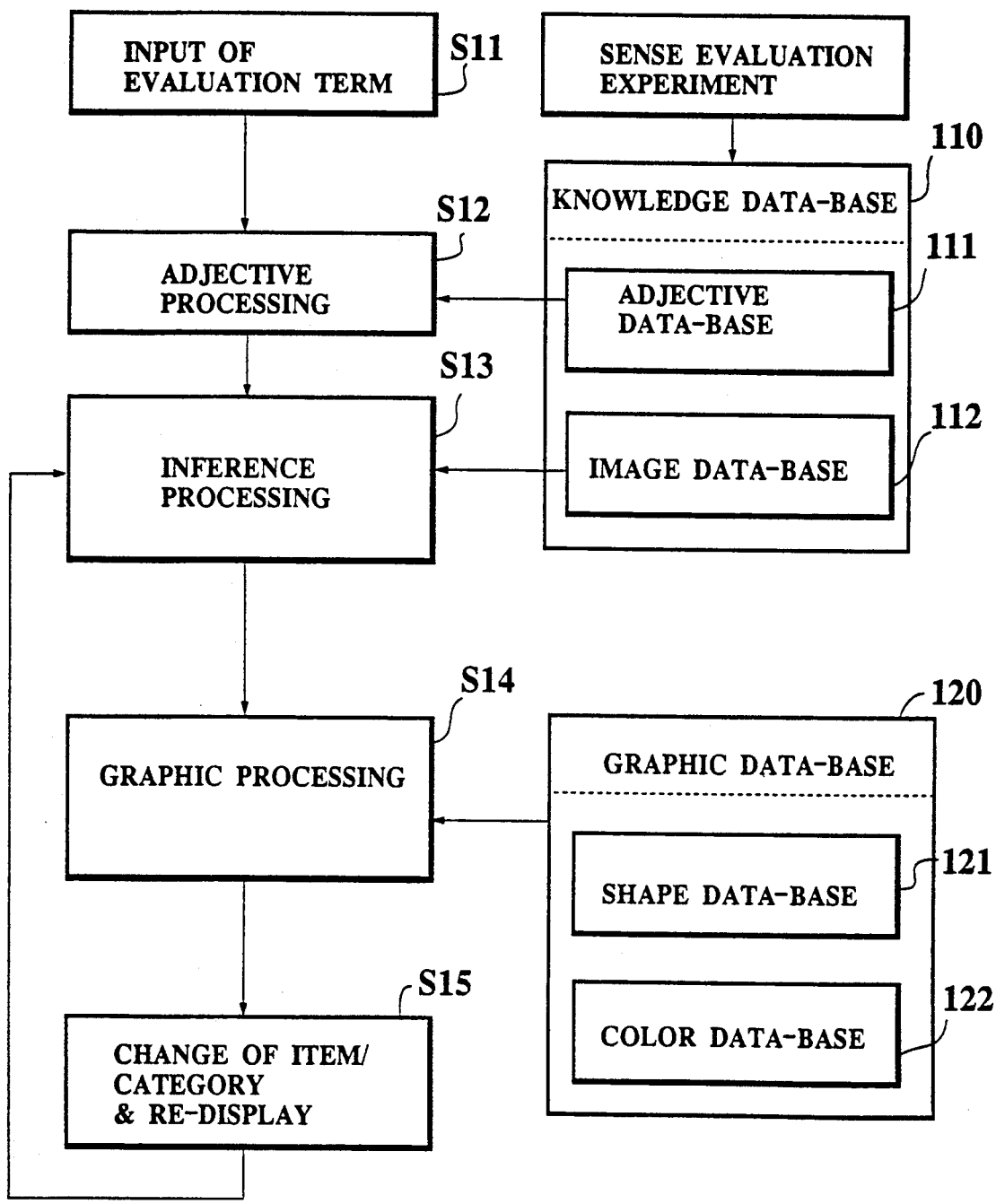

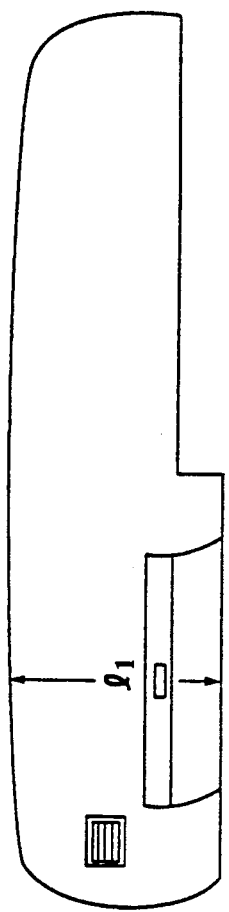
FIG.10 (A) PRIOR ART
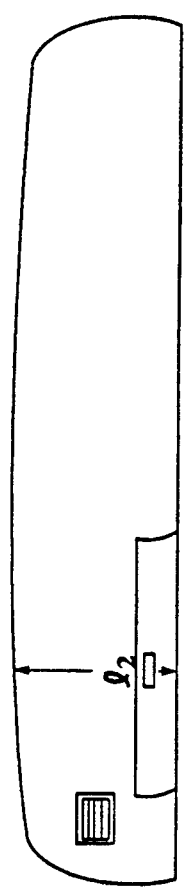
FIG.10 (B) PRIOR ART
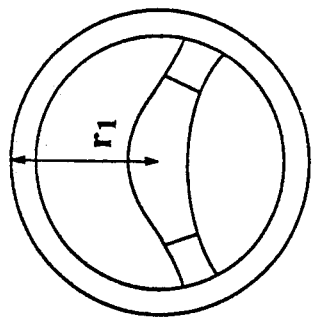
FIG.9 (A) PRIOR ART
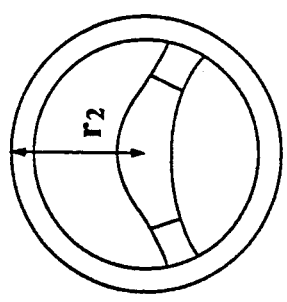
FIG.9 (B) PRIOR ART
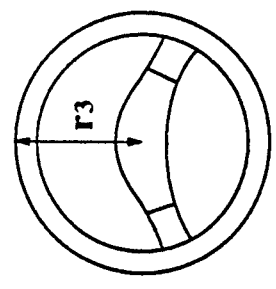
FIG.9 (C) PRIOR ART

FIG.12

| ITEM | NUMBER OF METERS | | PAD SIZE | | STEERING WHEEL RADIUS | | DOOR THICK-NESS |
|---|---|---|---|---|---|---|---|
| | RANGE | WEIGHT FACTOR | RANGE | WEIGHT FACTOR | RANGE | WEIGHT FACTOR | RANGE |
| EASY TO CONCENTRATE | 0.2,0.4 | .42 | 0.1,0.7 | .35 | 0.0,0.4 | .40 | 0.6,1.0 |
| HARD TO CONCENTRATE | 0.7,0.9 | .45 | 0.4,1.0 | .40 | 0.6,1.0 | .37 | 0.0,0.4 |
| SUITABLE FOR FAST DRIVING | 0.6,1.0 | .56 | 0.0,0.6 | .35 | 0.0,0.2 | .55 | 0.2,1.0 |
| SUITABLE FOR ALL TASTE | 0.0,0.6 | .55 | 0.4,1.0 | .25 | 0.6,1.0 | .42 | 0.4,1.0 |
| GORGEOUS | 0.8,1.0 | .51 | 0.6,1.0 | .52 | 0.6,1.0 | .50 | 0.8,1.0 |
| MODEST | 0.0,0.4 | .78 | 0.0,0.2 | .55 | 0.4,1.0 | .36 | 0.0,0.2 |
| BRIGHT | 0.0,0.8 | .29 | 0.0,0.4 | .32 | 0.4,1.0 | .21 | 0.4,1.0 |
| DARK | 0.0,0.6 | .24 | 0.4,1.0 | .25 | 0.2,1.0 | .23 | 0.0,0.6 |

FIG.16

| ITEM | STEERING WHEEL RADIUS | | | DOOR THICKNESS | |
|---|---|---|---|---|---|
| | RANGE (MEMBERSHIP FUNCTION) | | MAX.VALUE | RANGE (MEMBERSHIP FUNCTION) | |
| | PATTERN DEFINING COORDINATES | PATTERN NUMBER | | PATTERN DEFINING COORDINATES | |
| EASY TO CONCENTRATE | 0.2,0.4 | 1 | 0.40 | 0.3,0.5,0.9 | |
| HARD TO CONCENTRATE | 0.5,0.8,0.9,1.0 | 5 | 0.37 | 0.0,0.2,0.4,0.7 | |
| SUITABLE FOR FAST DRIVING | 0.0,0.2 | 1 | 0.55 | 0.2,0.5,0.8,0.2, | |
| SUITABLE FOR ALL TASTE | 0.5,0.7,0.9,0.3,0.6 | 4 | 0.42 | 0.3,0.6,0.9,0.3, | |
| GORGEOUS | 0.4,0.6,0.8 | 2 | 0.50 | 0.8,1.0 | |
| MODEST | 0.2,0.4,0.7,0.4,0.6 | 3 | 0.36 | 0.6,0.8,0.9,1.0 | |
| BRIGHT | 0.2,0.5,0.7 | 6 | 0.21 | 0.3,0.6,0.8,0.2, | |
| DARK | 0.2,0.4,0.7 | 2 | 0.23 | 0.1,0.3,0.5,0.7 | |

PATTERN 1

PATTERN 2

PATTERN 3

PATTERN 4

PATTERN 5

PATTERN 6

SYSTEM FOR DESIGNING CONFIGURATION WITH DESIGN ELEMENTS CHARACTERIZED BY FUZZY SETS

BACKGROUND OF THE INVENTION

1. Field of the Invention

The present invention relates to a system for designing a configuration in accordance with human impressions associated with the configuration to be designed.

2. Description of the Background Art

A system for designing an interior configuration of a house called HULIS (Human Living System) has been proposed for example in the Electronic Information Society Publication, supplement, Vol. 3, pp. 245-247, March 1988, which is schematically shown in FIG. 1.

This system comprises a computer unit 101 having a processing unit 107, a knowledge data-base 110, and a graphic data-base 120; an input unit 103; and a display unit 105.

The knowledge data-base 110 includes an adjective data-base 111 which memorizes knowledges on a number of evaluation terms in forms of adjectives expressing human impressions associated with each design element such as gorgeous, spacious, relaxed, etc. and various relationships among the evaluation terms; and an image data-base 112 which memorizes knowledges on a number of design elements representing various forms of each component of a house such as an entrance, a bath room, a living room, a kitchen, bed room, etc. and various relationships between the evaluation terms and the design elements.

Thus, when an operator enters a particular component such as "bed room" and a desired evaluation term such as "spacious" through the input unit 103, the processing unit 107 searches through the knowledge data-base 110 to infer and extract the most appropriate design element for that component of "bed room" with that evaluation term "spacious" among those memorized in the knowledge data-base 110. Then, the processing unit 107 processes the extracted design element graphically by using a shape data-base 121 and a color data-base 122 of the graphic data-base 120, such that the extracted design element can be displayed in an appropriately processed form on the display unit 105.

Such a system for designing an interior configuration of a house can also be utilized as a system for designing an interior configuration of an automobile by constructing the knowledge data-base 110 in terms of design elements and evaluation terms suitable for an automobile interior, as disclosed in U.S. patent application Ser. No. 07/627,283 (1990).

In this case, the knowledge data-base 110 includes an adjective data-base 111 which memorizes knowledges on a number of evaluation terms in forms of adjectives expressing human impressions associated with each design element for an automobile interior such as gorgeous, spacious, suitable for fast driving, etc. and various relationships among the evaluation terms and an image data-base 112 which memorizes knowledges on a number of design elements representing various forms of each component of an automobile interior such as an instrument panel, a meter cluster, a center cluster, etc. and various relationships between the evaluation terms and the design elements.

Here, the knowledge data-base 110 is prepared by carrying out an evaluation term compiling operation to collect the appropriate evaluation terms, and a sense evaluation experiment in which samples of impressions associated with each design element are collected from a number of test persons in order to establish the relationships between the evaluation terms and the design elements empirically.

For example, as shown in FIG. 2, the relationships among the evaluation terms in the adjective data-base 111 can be given in terms of data on factor loads for the evaluation terms obtained by the factor analysis of the compiled evaluation terms. Here, the factors are derived by using the multivariate analysis and each factor load expresses a degree to which each evaluation term is related to each factor. In this case of FIG. 2, those evaluation terms for which the factor loads for some factor are similarly large can be considered as closely related in that respect. This adjective data-base 111 is utilized in finding a term similar to an input evaluation term which has not been utilized in the sense evaluation experiment to prepare the image data-base 112.

Now, as shown in FIG. 3, the design elements includes a number of items such as a meter size and an instrument panel thickness, and each item is divided into a plurality of categories representing a plurality of possible choices for each item such as large, medium, and small for the meter size.

Then, the actual impressions experienced by a plurality of test persons upon seeing a design element corresponding to each category of each item are compiled and analyzed by the multivariate analysis, such that as shown in FIG. 4 the relationships between the evaluation terms and the design elements in the image data-base 112 can be given in terms of partial regression coefficients (correlation coefficients). In this case of FIG. 4, those categories (marked by asterisks in FIG. 4) for which the absolute value of the partial regression coefficient for each evaluation term is largest among the categories for the respective item can be considered as most influential to that evaluation term, and the signs of the partial regression coefficients indicate the positive or negative influence.

On the other hand, the graphic data-base 120 includes a shape data-base 121 which memorizes data on shapes for various design elements; and a color data-base 122 which memorizes data on colors for various design elements.

As shown in FIG. 5, the shape data-base 121 memorizes graphic data on a basic framework BF and various units for filling in the basic framework BF such as an instrument panel unit IP, a meter cluster unit MC, and a center cluster unit CC, so as to obtain a complete configuration CL. Each unit is constructed from a plurality of items of the design elements, so that there are as many patterns for each unit as a product of a number of categories for each item included. For example, a steering wheel is constructed from three items including a number of spokes, a pad size, and a steering wheel radius, where a number of spokes has three categories (two, three, four), and a pad size has three categories (large, medium, small), while the steering wheel radius has three categories (large, medium, small), then there are $3 \times 3 \times 3 = 27$ patterns prepared for the steering wheel.

The color data-base 122 memorizes data on colors by which each design element is to be colored. For example, in the steering wheel, the pad can be colored in grey, the spokes can be colored in silver, and the remaining part can be colored in dark gray.

Referring now to FIG. 6, the designing operation of this designing system will be described.

First, at the step S11, an operator enters an input evaluation term such as "easy to concentrate" for instance, through the input unit 103.

Then, at the step S12, an appropriate adjective processing is applied to the input evaluation term, such that when the input evaluation term is not present in the image data-base 112 prepared by the sense evaluation experiment, the term similar to this input evaluation term is searched out by using the adjective data-base 111.

Next, at the step S13, an inference processing is carried out by the processing unit 107 such that those categories in the knowledge data-base 110 for which the partial regression coefficient for this evaluation term of "easy to concentrate" is maximum among the categories of the respective item are inferred and extracted by the processing unit 107.

Here, in a case the operator enters two input evaluation terms such as "easy to concentrate" and "spacious" for instance, the partial regression coefficients for these two evaluation terms are summed for each category of each item, and those categories in the knowledge data-base 110 for which the sum of the partial regression coefficients for these two evaluation terms is maximum among the categories of the respective item are inferred and extracted by the processing unit 107.

Then, at the step S14, the following graphic processing is carried out by the processing unit 107 and the graphic data-base 120. First, the pattern corresponding to the extracted categories of the design elements is obtained by the processing unit 107 by using the shape data-base 121, so as to obtain the appropriate units to fill in the basic framework BF are constructed. Then, the obtained units are combined on the basic framework BF according to the flow chart shown in FIG. 7 to obtain the complete configuration CL. Namely, the basic framework BF is called up at the step S21, on which the instrument panel is superposed at the step S22, the meter cluster on which the steering wheel is added at the step S23 and the meters are added at the step S24 is superposed at the step S25, a center cluster on which a gear shift level is added at the step S26 is superposed at the step S27, a door is superposed at the step S28, and a seat is superposed at the step S29. Then, each design element in the complete configuration CL is colored according to the color data-base 122. Finally, the colored complete configuration is displayed on the display unit 105. For example, for the input evaluation term of "chic" a display shown in FIG. 8(A) can be obtained, while for the input evaluation term of "sporty" a display shown in FIG. 8(B) can be obtained.

Finally, at the step S15, upon inspecting the displayed configuration, the operator may change the items and the categories for each design element involved according to his own assessment, and the steps S13 and S14 are repeated in order to have the modified configuration including such changes are re-displayed on the display unit 105. Here, after the inspection, the operator may make the display unit 105 to display another configuration which is inferred by the processing unit 107 to be a less preferable candidate.

Now, such a conventional system for designing automobile interior has the following drawback.

Namely, in the design system described above, a number of categories assigned to each item of the design element is limited to a prescribed number. For example, the patterns for the steering wheel has been limited to only three categories shown in FIGS. 9(A), 9(B), and 9(C) corresponding to three different steering wheel radii of $r_1$, $r_2$, and $r_3$, and the patterns for the instrument panel has been limited to only two categories shown in FIGS. 10(A) and 10(B) corresponding to two different instrument panel thickness of $l_1$ and $l_2$.

Consequently, the configuration can be designed only as a combination of a prescribed number of predetermined patterns, even when a subtle variation of certain design element could affect the impression of the entire configuration significantly.

SUMMARY OF THE INVENTION

It is therefore an object of the present invention to provide a system for designing a configuration capable of accounting for subtle variations of each design element involved.

According to one aspect of the present invention there is provided a system for designing a configuration defined in terms of a plurality of design elements, comprising: input means for entering evaluation terms which expresses impressions associated with the design elements; fuzzy knowledge data-base means for memorizing relationships between the evaluation terms and the design elements in terms of fuzzy sets represented by membership functions; fuzzy processing means for inferring a pattern of each design element appropriate for the evaluation terms entered by the input means according to the fuzzy knowledge data-base means, and constructing the configuration from the pattern of each design element inferred; and output means for outputting the configuration constructed by the fuzzy processing means.

According to another aspect of the present invention there is provided a method of designing a configuration defined in terms of a plurality of design elements, comprising the steps of: entering evaluation terms which expresses impressions associated with the design elements; preparing fuzzy knowledge data-base means for memorizing relationships between the evaluation terms and the design elements in terms of fuzzy sets represented by membership functions; inferring a pattern of each design element appropriate for the evaluation terms entered at the entering step according to the fuzzy knowledge data-base means, and constructing the configuration from the pattern of each design element inferred; and outputting the configuration constructed by the fuzzy processing means.

Other features and advantages of the present invention will become apparent from the following description taken in conjunction with the accompanying drawings.

BRIEF DESCRIPTION OF THE DRAWINGS

FIG. 1 is a schematic block diagram of a conventional system for designing a configuration.

FIG. 2 is a table representing a knowledge on relationships among evaluation terms memorized in a knowledge data-base of the system of FIG. 1.

FIG. 3 is a table representing a knowledge on items and categories of design elements memorized in a knowledge data-base of the system of FIG. 1.

FIG. 4 is a table representing a knowledge on relationships between evaluation terms and design elements memorized in a knowledge data-base of the system of FIG. 1.

FIG. 5 is an illustration of various graphic shapes for constructing graphic display which are memorized in a graphic data-base of the system of FIG. 1.

FIG. 6 is a flow chart for the designing operation of the system of FIG. 1.

FIGS. 9(A), 9(B), and 9(C) are illustrations of three patterns for a steering wheel memorized in a graphic data-base of the system of FIG. 1.

FIGS. 10(A) and 10(B) are illustrations of two patterns for an instrument panel memorized in a graphic data-base of the system of FIG. 1.

FIG. 12 is a table representing a knowledge memorized in a fuzzy image data-base of the system of FIG. 11.

FIG. 16 is a table representing a knowledge memorized in a fuzzy image data-base of a second embodiment of a system for designing a configuration according to the present invention.

DETAILED DESCRIPTION OF THE PREFERRED EMBODIMENTS

In the following, the various embodiments of a system for designing a configuration according to the present invention will be described as a system for designing a configuration of an automobile, although the system for designing a configuration according to the present invention has a wider application to the designing of other configurations such as those of ships and airplanes.

It is also to be noted that a term "configuration" will be used in very broad sense in the following description, such that this term signifies all the designing features of the interior and exterior of the automobile including not only a spatial arrangement, a shape outline, etc., but also a size relationship, a color coordination, etc. as well.

Figure 7:
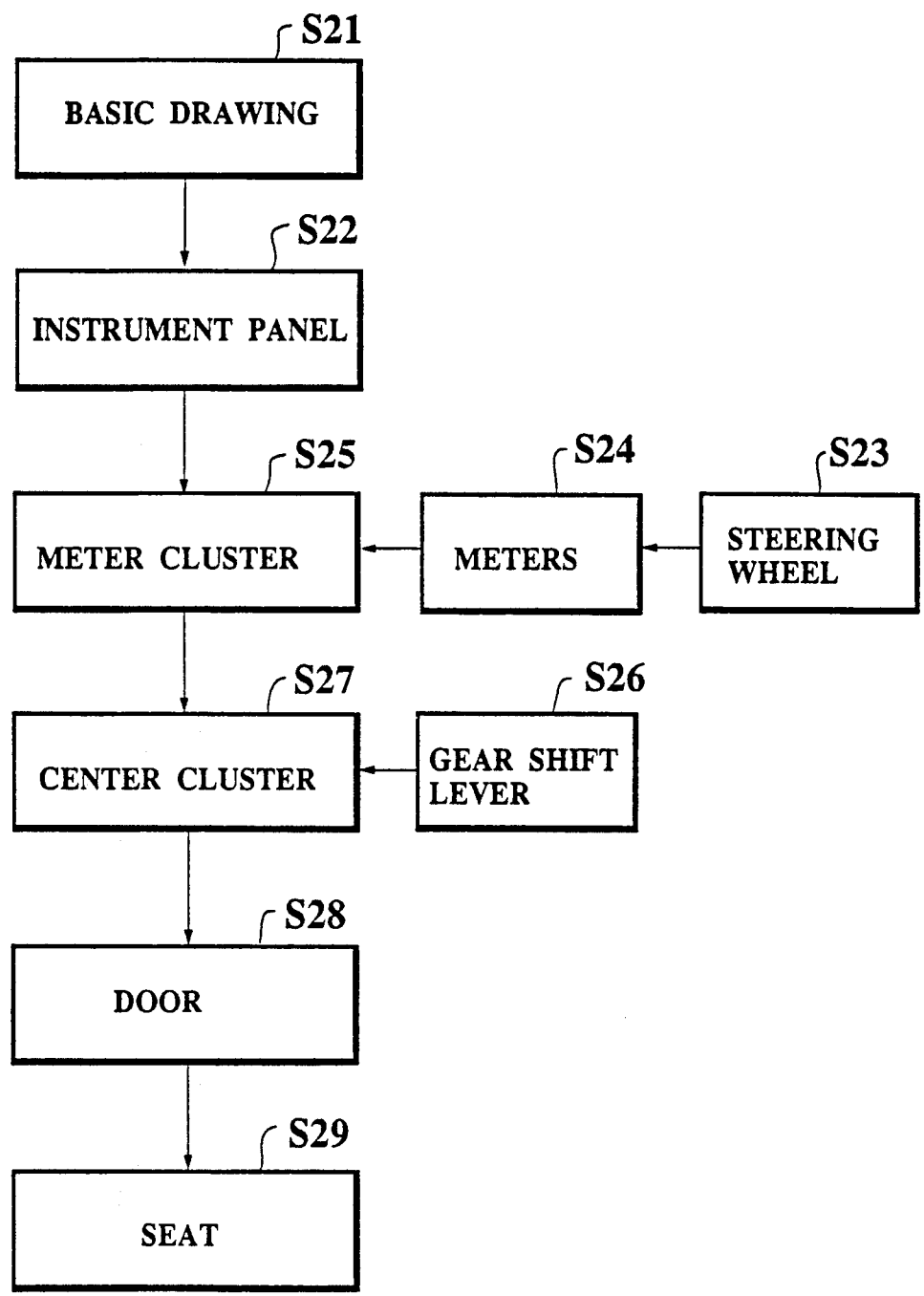
FIG. 7 is a flow chart for the operation of graphic display construction in the designing operation of FIG. 6.
Figure 8:
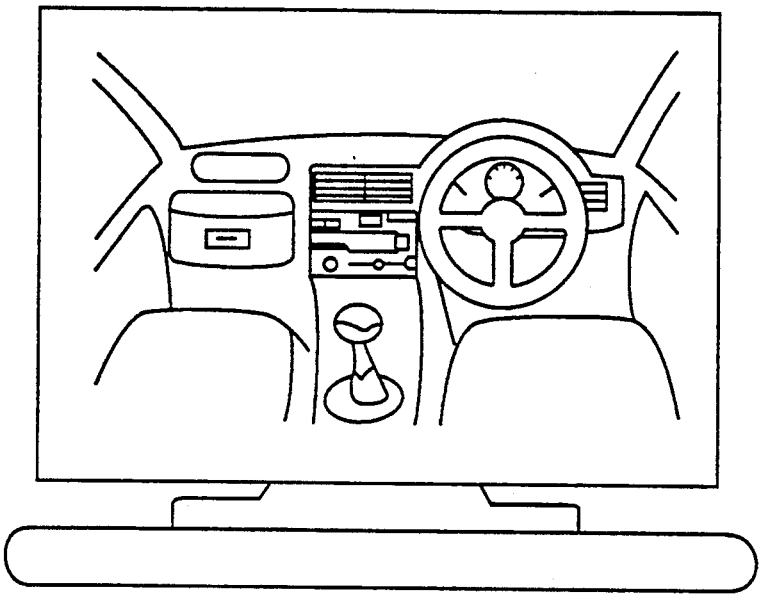
FIGS. 8(A) and 8(B) are illustrations of two examples of a graphic display obtained by the designing operation of FIG. 6.
Figure 8:
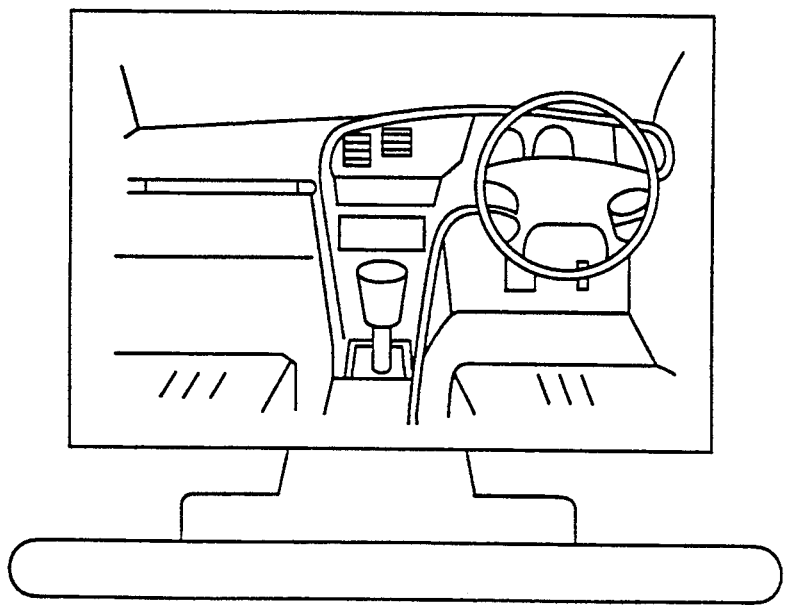
Figure 11:
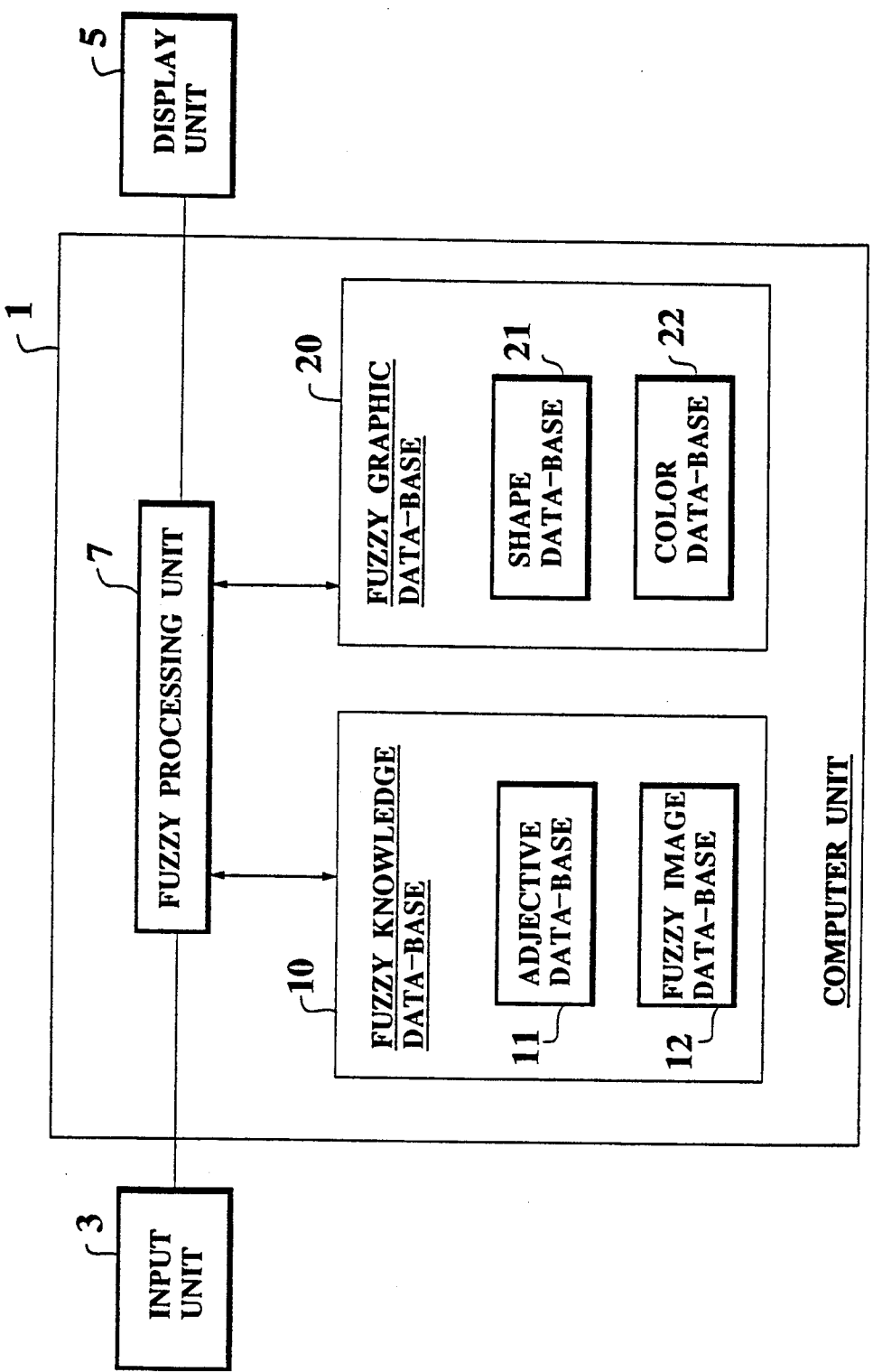
FIG. 11 is a schematic block diagram of a first embodiment of a system for designing a configuration according to the present invention.

Referring now to FIG. 11, a first embodiment of a system for designing a configuration according to the present invention will be described in detail.

In this embodiment, the system comprises: a computer unit 1 having a fuzzy processing unit 7, a fuzzy knowledge data-base 10, and a fuzzy graphic data-base 20; an input unit 3; and a display unit 5.

The fuzzy knowledge data-base 10 includes an adjective data-base 11 which memorizes knowledges on a number of evaluation terms in forms of adjectives expressing human impressions associated with each design element for an automobile interior such as gorgeous, spacious, suitable for fast driving, etc. and various relationships among the evaluation terms; and a fuzzy image data-base 12 which memorizes knowledges on a number of design elements representing various forms of each component of an automobile interior such as an instrument panel, a meter cluster, a center cluster, etc. and various relationships between the evaluation terms and the design elements in terms of fuzzy sets.

Here, the adjective data-base 11 of the fuzzy knowledge data-base 10 is prepared by carrying out an evaluation term compiling operation to collect the appropriate evaluation terms. For example, similarly to the conventional case, the relationships among the evaluation terms in the adjective data-base 11 can be given in terms of data on factor loads for the evaluation terms obtained by the factor analysis of the compiled evaluation terms as shown in FIG. 2. Here, the factors are derived by using the multivariate analysis and each factor load expresses a degree to which each evaluation term is related to each factor. In this case of FIG. 2, those evaluation terms for which the factor loads for some factor are similarly large can be considered as closely related in that respect. This adjective data-base 11 is utilized in finding a term similar to an input evaluation term which has not been utilized in the sense evaluation experiment to prepare the image data-base.

In the fuzzy image data-base 12 of the fuzzy knowledge data-base 10, the design elements includes a number of items such as a number of meters, pad size, steering wheel radius, and door thickness as shown in FIG. 12. The relationships between the evaluation terms and the design elements in the fuzzy image data-base 12 are given in terms of fuzzy sets. Namely, for each item of a design element such as "steering wheel radius" for instance, a fuzzy set such as that for "radius is large" is set up, such that the item can continuously be varied for the membership value between 0 to 1, where the value closer to 1 represents the larger radius.

This fuzzy image data-base 12 is prepared by carrying out a sense evaluation experiment in which the actual impressions experienced by a plurality of test persons upon seeing each design element are complied and then analyzing the result of this sense evaluation experiment by using a statistical analysis procedure such as a multiple regression analysis, quantification method analysis, and multivariate analysis.

More specifically, the fuzzy image data-base 12 memorizes the knowledge on the relationships between the evaluation terms and the design elements in a form shown in FIG. 12, where each relationship is specified in terms of a range (type II fuzzy set) and a weight factor (MAX value). For example, for the evaluation term of "easy to concentrate" and the design element item of "steering wheel radius", the range is specified as (0.0, 0.4) which indicates that the radius corresponding to the membership value within a range between 0.0 to 0.4 has a significant level of influence on the evaluation term of "easy to concentrate", and a level of influence by the radius corresponding to the membership value equal to a middle value of this range 0.2 is specified as the weight factor 0.4, while the level of influence by the radii corresponding to the largest and smallest membership values of 0.0 and 0.4 are set equal to zero, so that this fuzzy set can be represented by a triangle defined by these zero value points and the MAX value point.

On the other hand, the graphic data-base 20 includes a shape data-base 21 which memorizes data on shapes for various design elements; and a color data-base 22 which memorizes data on colors for various design elements.

As shown in FIG. 5, the shape data-base 21 memorizes graphic data on a basic framework BF and various units for filling in the basic framework BF such as an instrument panel unit IP, a meter cluster unit MC, and a center cluster unit CC, so as to obtain a complete configuration CL.

The color data-base 22 memorizes data on colors by which each design element is to be colored. For example, in the steering wheel, the pad can be colored in grey, the spokes can be colored in silver, and the remaining part can be colored in dark gray.

Figure 13:
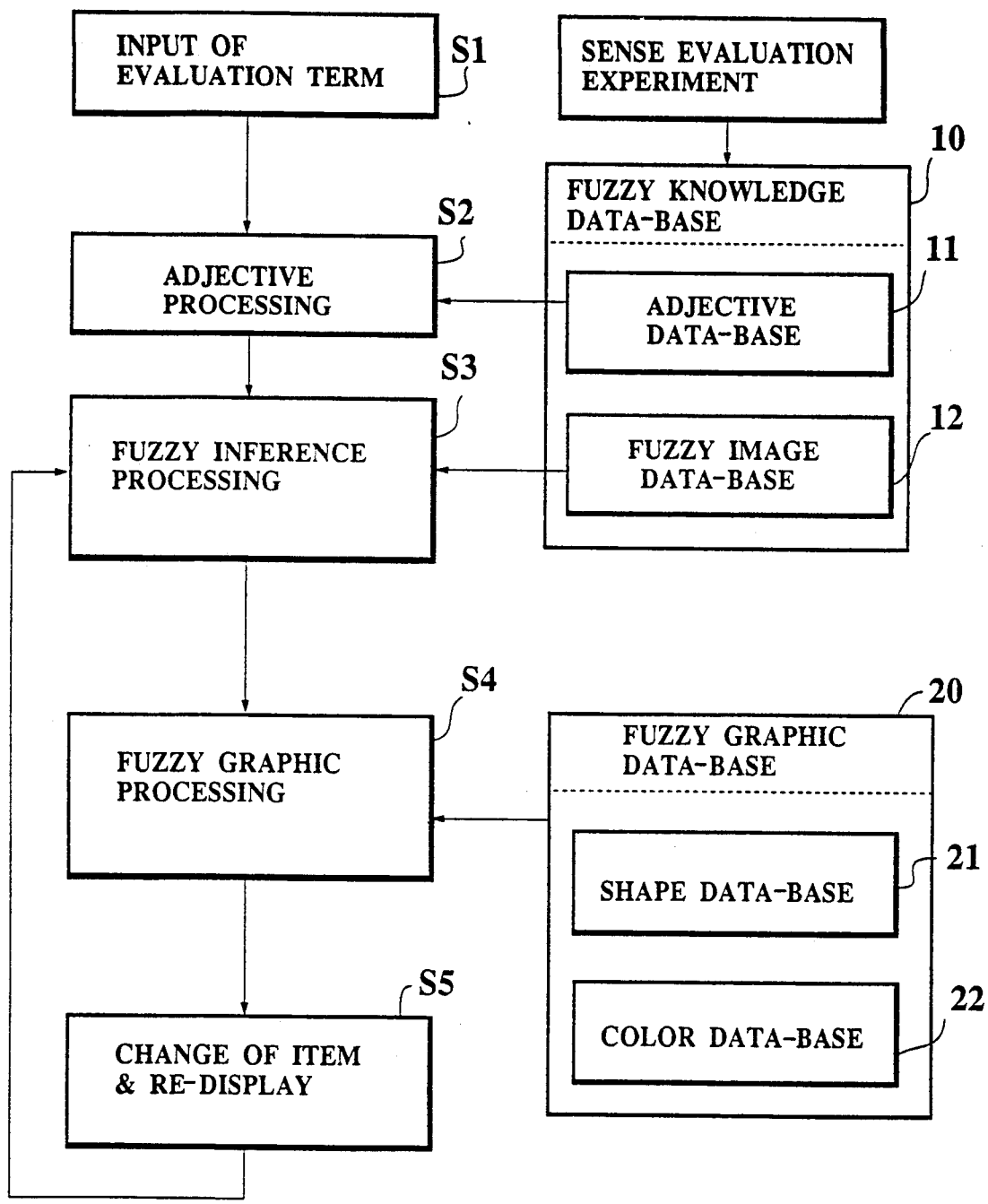
FIG. 13 is a flow chart for the designing operation of the system of FIG. 11.

Referring now to FIG. 13, the designing operation of this designing system will be described.

First, at the step S1, an operator enters one input evaluation term such as "easy to concentrate" for instance, or a plurality of input evaluation terms such as "easy to concentrate" and "suitable for fast driving", through the input unit 3.

Then, at the step S2, an appropriate adjective processing is applied to each input evaluation term, such that when the input evaluation term is not present in the fuzzy image data-base 12, the term similar to this input evaluation term is searched out by using the adjective data-base 11.

Next, at the step S3, a fuzzy inference processing to be described in detail below is carried out by the fuzzy processing unit 7 and the fuzzy knowledge data-base 10 in order to infer and extract appropriate patterns of the design elements in the fuzzy knowledge data-base 10.

Then, at the step S4, a fuzzy graphic processing to be described in detail below is carried out by the fuzzy processing unit 7 and the graphic data-base 20 in order to obtain a display of a complete configuration based on the appropriate patterns of the design elements inferred at the step S3, which is to be displayed on the display unit 5.

Finally, at the step S5, upon inspecting the displayed configuration, the operator may change the items for each design element involved according to his own assessment, and the steps S3 and S4 are repeated in order to have the modified configuration accounting for such changes are redisplayed on the display unit 5. Here, after the inspection, the operator may make the display unit 5 to display another configuration which is inferred by the fuzzy processing unit 7 to be a less preferable candidate.

Referring now to FIGS. 14(A) to 14(F) in which a vertical axis represents a weight factor and a horizontal axis represents a membership value, the fuzzy inference processing at the step S3 of the flow chart of FIG. 13 will now be described in detail. Here, the following description will be given for an exemplary case of obtaining an appropriate pattern for the design element item "steering wheel radius".

First, a case in which the evaluation term "easy to concentrate" is entered at the step S1 as the input evaluation term is described.

In this case, according to the fuzzy image data-base 12 shown in FIG. 12, a range of the design element item "steering wheel radius" with respect to this evaluation term "easy to concentrate", i.e., the membership value for the fuzzy set of "radius is large", is given as 0.0 to 0.4, while the weight factor is given as 0.4.

Figure 14:
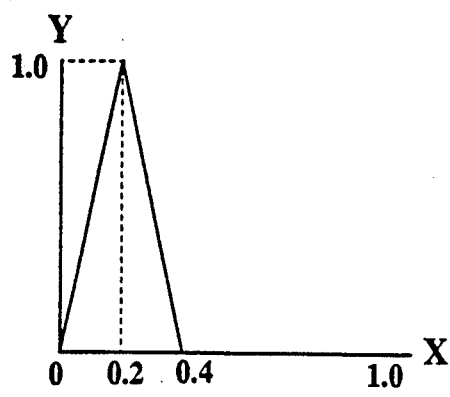
FIGS. 14(A) to 14(F) are graphs for explaining a fuzzy calculation process for determining appropriate design element patterns in the system of FIG. 11.
Figure 14:
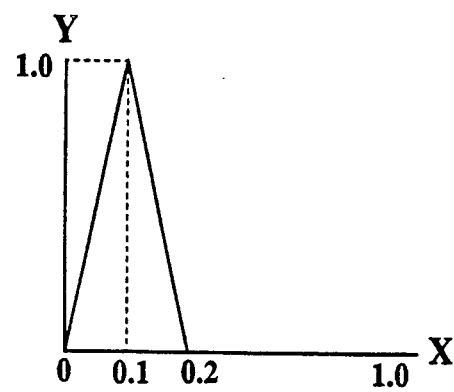
Figure 14:
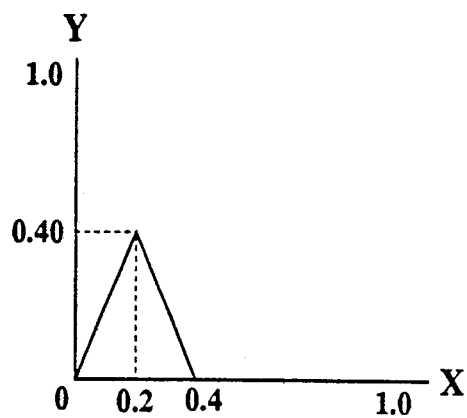
Figure 14:
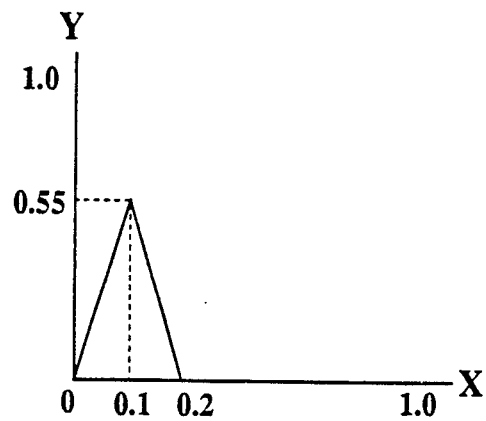
Figure 14:
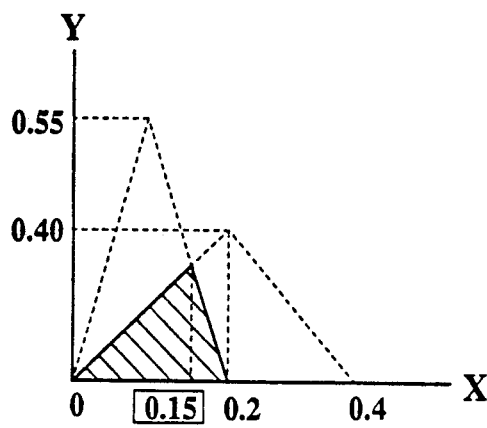
Figure 14:
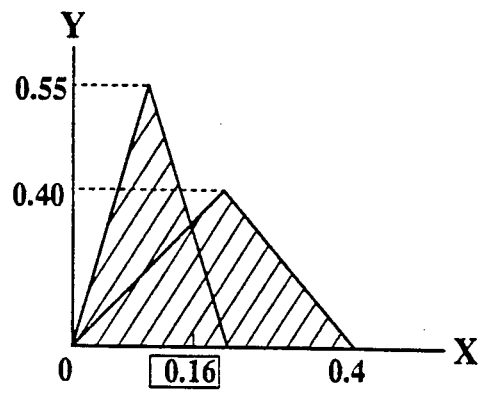

Accordingly, the fuzzy processing unit 7 first constructs the membership function for a triangular fuzzy set as shown in FIG. 14(A) in which the level of influence by the membership value equal to a middle value of this range 0.2 is set equal to 1.0 while the level of influence by the largest and smallest membership values of 0.0 and 0.4 are set equal to zero.

Then, this membership function of FIG. 14(A) is multiplied by the weight factor 0.4 of the design element item "steering wheel radius" with respect to the evaluation term "easy to concentrate" to obtain the membership function for a triangular fuzzy set as shown in FIG. 14(B) in which the level of influence by the membership value equal to a middle value of this range 0.2 is equal to 0.4 while the level of influence by the largest and smallest membership values of 0.0 and 0.4 are equal to zero.

Consequently, the radius corresponding to the membership value of 0.2 is inferred for the design element item "steering wheel radius" appropriate for the evaluation term "easy to concentrate".

Next, a case in which two evaluation terms "easy to concentrate" and "suitable for fast driving" are entered at the step S1 as the input evaluation terms is described.

In this case, the design element item "steering wheel radius" appropriate for the evaluation terms "easy to concentrate" and "suitable for fast driving" is obtained by the fuzzy composition using such a method as a MIN-MAX composition method or an area centroid method from the membership function of the design element item "steering wheel radius" with respect to the evaluation term "easy to concentrate" and the membership function of the design element item "steering wheel radius" with respect to the evaluation term "suitable for fast driving".

Namely, the membership function of the design element item "steering wheel radius" with respect to the evaluation term "easy to concentrate" is obtained as described above with reference to FIGS. 14(A) and 14(B).

In a similar manner, according to the fuzzy image data-base 12 shown in FIG. 12, a range of the design element item "steering wheel radius" with respect to this evaluation term "suitable for fast driving" is given as 0.0 to 0.2, while the weight factor is given as 0.55. Thus, the membership function of the design element item "steering wheel radius" with respect to the evaluation term "suitable for fast driving" is obtained by first constructing the membership function as shown in FIG. 14(C) in which the level of influence by the membership value equal to a middle value of this range 0.1 is set equal to 1.0 while the level of influence by the largest and smallest membership values of 0.0 and 0.2 are set equal to zero, and then multiplying this membership function of FIG. 14(C) by the corresponding weight factor 0.55 to obtain the membership function shown in FIG. 14(D) in which the level of influence by the membership value equal to a middle value of this range 0.1 is set equal to 0.55 while the level of influence by the largest and smallest membership values of 0.0 and 0.2 are set equal to zero.

Then, the design element item "steering wheel radius" appropriate for the evaluation terms "easy to concentrate" and "suitable for fast driving" is obtained by the fuzzy composition of these two membership functions of FIGS. 14(B) and 14(D). For example, in a case the MIN-MAX composition method is used, the radius corresponding to the membership value of 0.15 is inferred for the design element item "steering wheel radius" appropriate for the evaluation terms "easy to concentrate" and "suitable for fast driving" as shown in FIG. 14(E), whereas in a case the area centroid method is used, the radius corresponding to the membership value of 0.16 is inferred for the design element item "steering wheel radius" appropriate for the evaluation terms "easy to concentrate" and "suitable for fast driving" as shown in FIG. 14(F).

Figure 15:
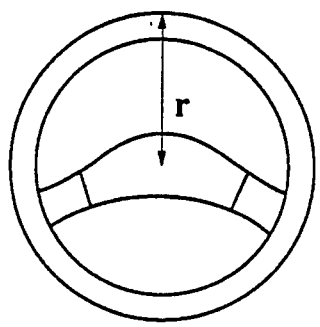
FIGS. 15(A) and 15(B) are illustration of patterns for a steering wheel and an instrument panel memorized in a fuzzy graphic data-base of the system of FIG. 11.
Figure 15:
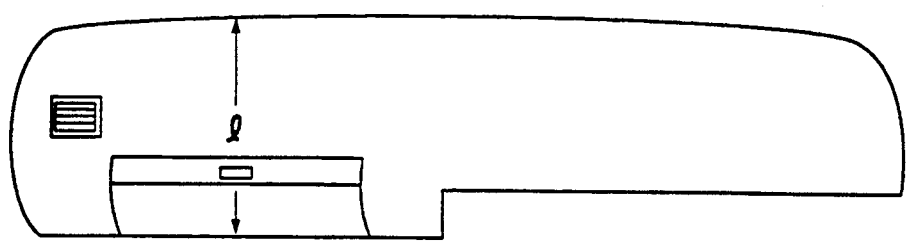
Figure 17:
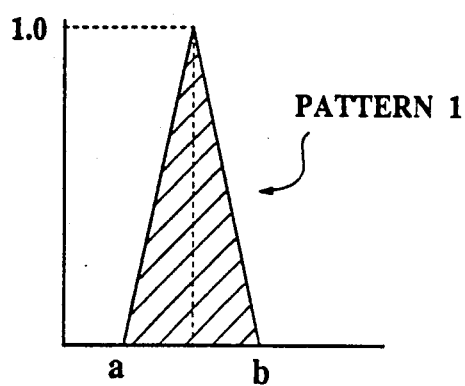
FIGS. 17(A) to 17(F) are graphs showing six different membership function patterns used in the second embodiment.
Figure 17:
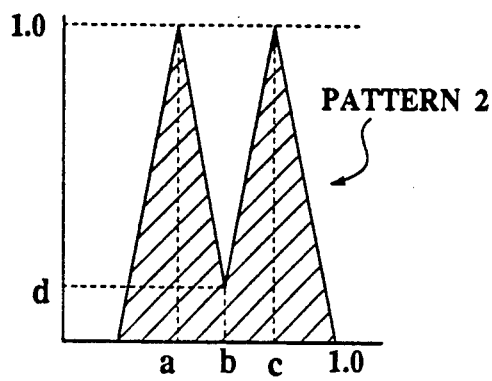
Figure 17:
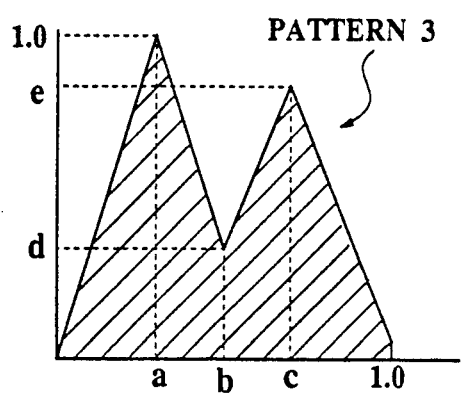
Figure 17:
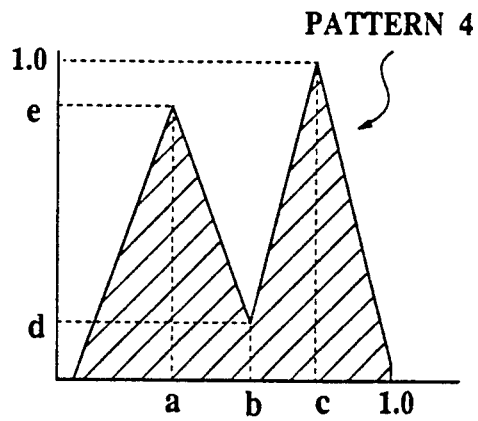
Figure 17:
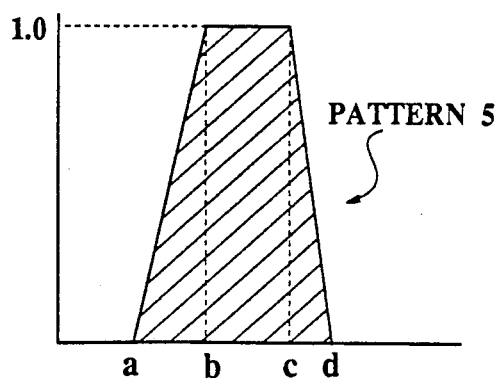
Figure 17:
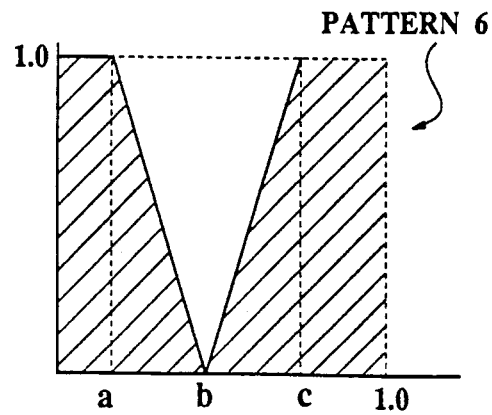

Referring next to FIGS. 15(A) and 15(B), the fuzzy graphic processing at the step S4 of the flow chart of FIG. 13 will now be described in detail.

Here, the design element item "steering wheel radius" can take any of a continuous membership value within the range between 0 to 1, so that the radius r of a graphic image of the steering whell memorized by the shape data-base 21 which is shown in FIG. 15(A) is taken to be continuous, and given as:

$$r = a \times (r_1 - r_0) + r_0$$

where $a$ is the membership value, $r_1$ is the radius for a case $a=1$, and $r_0$ is the radius for a case $a=0$.

At the graphic processing of the step S3, the pattern for the design element of the steering wheel with an appropriate radius r determined according to the above expression by using the inferred membership value is obtained by graphically processing the graphic image of FIG. 15(A).

Similarly, the design element item "instrument panel thickness" can take any of a continuous membership value within the range between 0 to 1, so that the thickness l of a graphic image of the instrument panel memorized by the shape data-base 21 which is shown in FIG. 15(B) is taken to be continuous, and given as:

$$l = a \times (l_1 - l_\theta) + l_\theta$$

where $a$ is the membership value, $l_1$ is the thickness for a case $a=1$, and $l_\theta$ is the thickness for a case $a=0$.

At the graphic processing of the step S3, the pattern for the design element of the instrument panel with an appropriate thickness l determined according to the above expression by using the inferred membership value is obtained by graphically processing the graphic image of FIG. 15(B).

Thus, according to this embodiment, the graphic display of each design element can be obtained with a continuous membership value assigned to each design element item, so that it becomes possible in this system for designing an automobile interior to account for subtle variations of each design element.

Referring now to FIG. 16, a second embodiment of a system for designing a configuration according to the present invention will be described in detail.

This second embodiment differs from the first embodiment described above in that several patterns are provided for the membership function of the fuzzy set in addition to the triangular pattern.

Accordingly, in this second embodiment, the fuzzy image data-base 12 memorizes the knowledge on the relationships between the evaluation terms and the design elements in a form shown in FIG. 16, where each relationship is specified in terms of pattern defining coordinates, a pattern number indicating a pattern of the membership function, and a MAX value.

Here, six patterns shown in FIG. 17(A) to 17(F) may be provided for the membership function, where a vertical axis represents a weight factor and a horizontal axis represents a membership value as before. For example, for the evaluation term of "suitable for all taste" and the design element item of "steering wheel radius", the membership function pattern specified is a pattern 4 shown in FIG. 17(D) with the MAX value equal to 0.42. This pattern 4 is defined in terms of five coordinates a, b, c, d, and e, and their values are specified in FIG. 16 as 0.5, 0.7, 0.9, 0.3, and 0.6, respectively. Thus, the membership function appropriate for the evaluation term of "suitable for all taste" and the design element item of "steering wheel radius", can be obtained by constructing the membership function of a form of the pattern 4 with $a=0.5$, $b=0.7$, $c=0.9$, $d=0.3$, and $e=0.6$, and then multiplying this by the MAX value 0.42.

The other features of this second embodiment are substantially similar to those of the first embodiment described above.

Thus, according to this second embodiment, because of the use of the severalnpatterns for the membership function, it becomes possible to infer the pattern of each design element for which the human impressions associated with each design element are reflected more accurately.

Referring now to FIGS. 18(A) to 18(E) in which a vertical axis represents a weight factor and a horizontal axis represents a membership value as before, a third embodiment of a system for designing a configuration according to the present invention will be described in detail.

This third embodiment differs from the first embodiment described above in that the method of fuzzy composition is modified in order to rectify the drawbacks of the MIN-MAX composition method and the area centroid method. of two membership functions of a certain design element item with respect to two evaluation terms, the MIN-MAX composition method has a tendency to receive a noticeable influence from the evaluation term having a lower weight factors among these two evaluation terms, so that the obtained membership value tends to be biased toward the side of the membership function with the lower weight factor.

On the other hand, the area centroid method requires complicated calculations, so that an enormous amount of time becomes necessary for processing the complicated fuzzy image data-base such as that of FIG. 12 or FIG. 16.

These drawbacks are avoided in this third embodiment by obtaining the fuzzy composition of two membership functions as follows. Here, the following description will be given for an exemplary case of obtaining an appropriate pattern for the design element item "steering wheel radius" with respect to two evaluation terms "easy to concentrate" and "suitable for fast driving".

Figure 18:
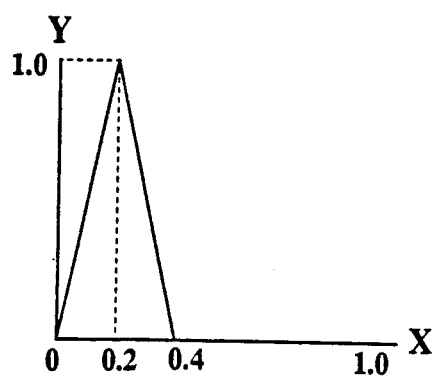
FIGS. 18(A) to 18(E) are graphs for explaining a fuzzy calculation process for determining appropriate design element patterns in a third embodiment of a system for designing a configuration according to the present invention.
Figure 18:
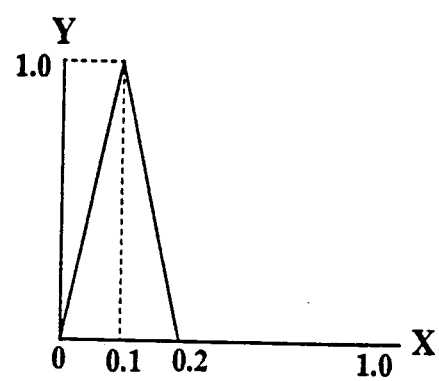
Figure 18:
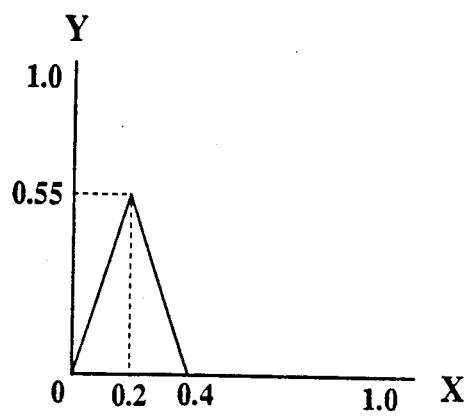
Figure 18:
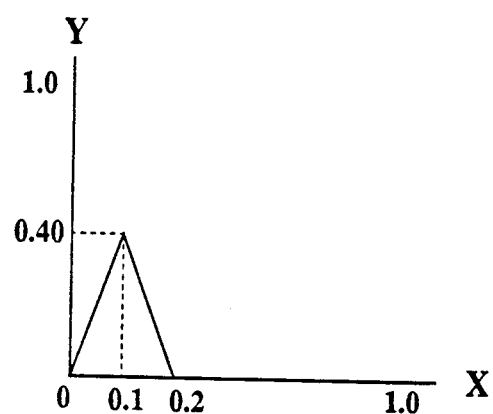
Figure 18:
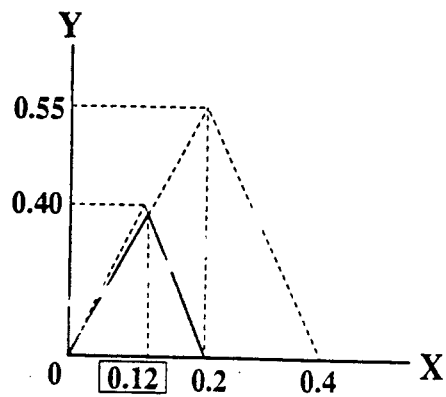

First, according to the fuzzy image data-base 12 shown in FIG. 12, the fuzzy processing unit 7 constructs the membership functions for the evaluation terms "easy to concentrate" and "suitable for fast driving" as shown in FIGS. 18(A) and 18(B), in each of which the level of influence by the membership value equal to a middle value of the range is set equal to 1.0, while the level of influence by the largest and smallest membership values are set equal to zero.

Then, each of the constructed membership functions are multiplied by the weight factor of the other one of the constructed membership functions. Namely, the membership function of FIG. 18(A) for the evaluation term "easy to concentrate" is multiplied by the weight factor 0.55 of the evaluation term "suitable for fast driving", while the membership function of FIG. 18(C) for the evaluation term "suitable for fast driving" is multiplied by the weight factor 0.4 of the evaluation term "easy to concentrate", so as to obtain the membership functions shown in FIGS. 18(B) and 18(D).

Then, the membership value for the design element item "steering wheel radius" is inferred from the fuzzy composition of these two membership functions of FIGS. 18(A) and 18(B) obtained by using the MIN-MAX composition method, which in this example is equal to 0.12 as shown in FIG. 18(E).

In a case more than three evaluation terms are entered as input, this method can be applied by constructing the membership function with the level of influence by the membership value equal to a middle value of the range equal to 1.0 for each evaluation term, multiplying each membership function by the weight factor of the other evaluation term, and obtaining the fuzzy composition of all the weight factor multiplied membership functions by using the MIN-MAX composition method.

Here, for example, the membership function associated with the largest weight factor among all the membership functions can be multiplied the smallest weight factor among all the weight factors associated with the membership functions, the membership function associated with the second largest weight factor among all the membership functions can be multiplied the second smallest weight factor among all the weight factors associated with the membership functions, and so on.

Alternatively, each membership function may be multiplied by an average of the weight factors associated with all the other membership functions.

It is to be noted that many modifications and variations of the above embodiments may be made without departing from the novel and advantageous features of the present invention. Accordingly, all such modifications and variations are intended to be included within the scope of the appended claims.

What is claimed is:

1. A system for designing a configuration of a physical structure according to a desired human sensory impression wherein said structure comprises a plurality of design elements, said system comprising:
    an input device for entering a plurality of evaluation terms which indicate human impressions to be met by viewing displays of the design elements;
    a fuzzy knowledge data-base having for each design element a plurality of stored fuzzy sets, each of said plurality corresponding to one from among said evaluation terms, each of said fuzzy sets having a plurality of membership function values representing a relationship between a range of physical characteristics of said design element and the evaluation terms;
    a fuzzy logic processor device for calculating a display pattern for each design element corresponding to the evaluation terms entered by the input device, said calculation in accordance with the relationships stored in the fuzzy knowledge data-base, and for constructing a display configuration from the pattern of each design element calculated; and
    a display device for displaying the graphic representation of said calculated configuration constructed by the fuzzy processor device, said graphic representation being in accordance with said desired human sensory impression.

2. The system of claim 1, wherein the fuzzy processor device infers the pattern of each design element by determining an appropriate membership value from the membership functions representing the fuzzy sets for the relationships between said each design element and the evaluation terms entered by the input device.

3. The system of claim 1, wherein the fuzzy processor device infers the pattern of each design element by using a weight factor associated with each fuzzy set.

4. The system of claim 1, wherein the pattern of each design element inferred by the fuzzy processor device specifies a size of each design element appropriate for each evaluation term.

5. The system of claim 1, wherein the membership functions representing the fuzzy sets include functions in a plurality of different forms.

6. The system of claim 1, wherein when more than two evaluation terms are entered by the input device, the fuzzy processor device infers the pattern of each design element by using a fuzzy composition of the membership functions for each evaluation term.

7. The system of claim 6, wherein the fuzzy composition is obtained by a MIN-MAX composition method.

8. The system of claim 6, wherein the fuzzy composition is obtained by an area centroid method.

9. The system of claim 6, wherein the fuzzy composition is obtained by constructing each triangular membership function for each evaluation term with the maximum level of influence for a middle value, multiplying each triangular membership function with a weight factor associated with triangular membership functions other than said each triangular membership function which are related to other evaluation terms, and obtaining a fuzzy composition of the triangular membership functions multiplied by the weight factors.

10. The system of claim 6, wherein the fuzzy composition is obtained by constructing each triangular membership function for each evaluation term with the maximum level of influence for a middle value, multiplying each triangular membership function with an average of weight factors associated with other triangular membership functions related to other evaluation terms, and obtaining a fuzzy composition of the triangular membership functions multiplied by the weight factors.

* * * * *